(12) United States Patent
Gordon et al.

(10) Patent No.: US 6,473,305 B1
(45) Date of Patent: Oct. 29, 2002

(54) FASTENING SYSTEM AND METHOD OF RETAINING TEMPERATURE CONTROL DEVICES USED ON SEMICONDUCTOR DIES

(75) Inventors: Glen P. Gordon, Graham; Pardeep K. Bhatti, University Place, both of WA (US)

(73) Assignee: Intel Corporation, Santa Clara, CA (US)

(*) Notice: Subject to any disclaimer, the term of this patent is extended or adjusted under 35 U.S.C. 154(b) by 56 days.

(21) Appl. No.: 09/695,933

(22) Filed: Oct. 26, 2000

(51) Int. Cl.[7] .................................................. H05K 7/20
(52) U.S. Cl. ...................... 361/704; 361/707; 361/700; 361/702; 361/719; 257/718; 257/715; 257/727; 174/16.3; 165/80.3; 165/185; 411/57; 24/452
(58) Field of Search ........................ 29/890.03; 361/704, 361/707, 709, 710, 717–721; 257/718, 719, 727; 165/80.3, 185; 174/16.3; 411/44, 48, 55, 57; 24/453

(56) References Cited

U.S. PATENT DOCUMENTS

| | | | | |
|---|---|---|---|---|
| 4,447,183 A | * | 5/1984 | Yunt ............................ 411/57 |
| 5,757,621 A | * | 5/1998 | Patel ........................... 361/719 |
| 5,883,782 A | * | 3/1999 | Thurston et al. ............ 364/704 |
| 5,978,223 A | * | 11/1999 | Hamilton et al. ........... 361/704 |
| 6,067,230 A | * | 5/2000 | Ashida et al. ............... 361/704 |
| 6,307,748 B1 | * | 10/2001 | Lin et al. ..................... 361/704 |
| 6,356,445 B1 | * | 3/2002 | Mochzuki et al. .......... 361/697 |
| 6,362,977 B1 | * | 3/2002 | Tucker et al. ............... 361/818 |
| 6,392,889 B1 | * | 5/2002 | Lee et al. .................... 361/704 |

* cited by examiner

Primary Examiner—Boris Chervinsky
(74) Attorney, Agent, or Firm—Antonelli, Terry, Stout & Kraus, LLP.

(57) ABSTRACT

A fastening system and a method for retaining temperature control devices used on semiconductor dies transfers the load of the temperature control devices around the semiconductor dies using a spring collet arrangement. An elongated spring collet is installed in a hole in the temperature control device so as to extend outwardly from the temperature control device with the spring collet being movable in the hole relative to the temperature control device in the direction of elongation of the spring collet. An expansion spring resiliently biases the spring collet so as to extend outwardly. An outer end of the spring collet is positioned in a pocket of a retention mechanism of a support member. An electrical connection is made as the temperature control device with semiconductor die is forced down until a pin grid array thereon is properly seated in a socket on the support member. A retention screw is then extended through the spring collet for connection with the retention mechanism and expansion of the spring collet into locking engagement with the temperature control device to retain the temperature control device.

20 Claims, 5 Drawing Sheets

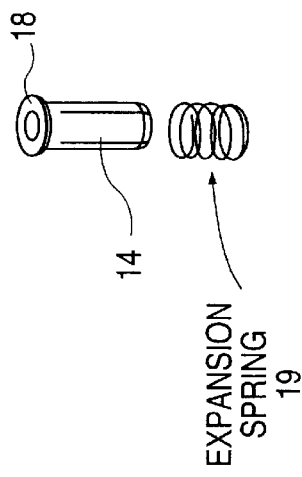
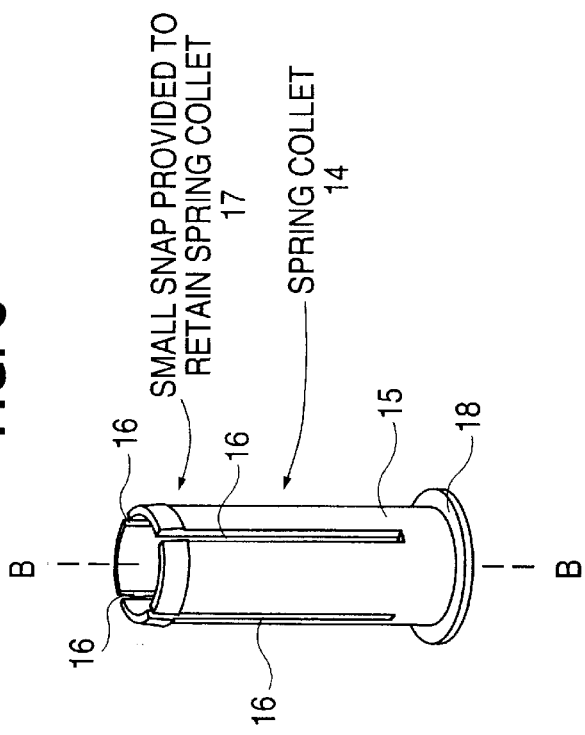
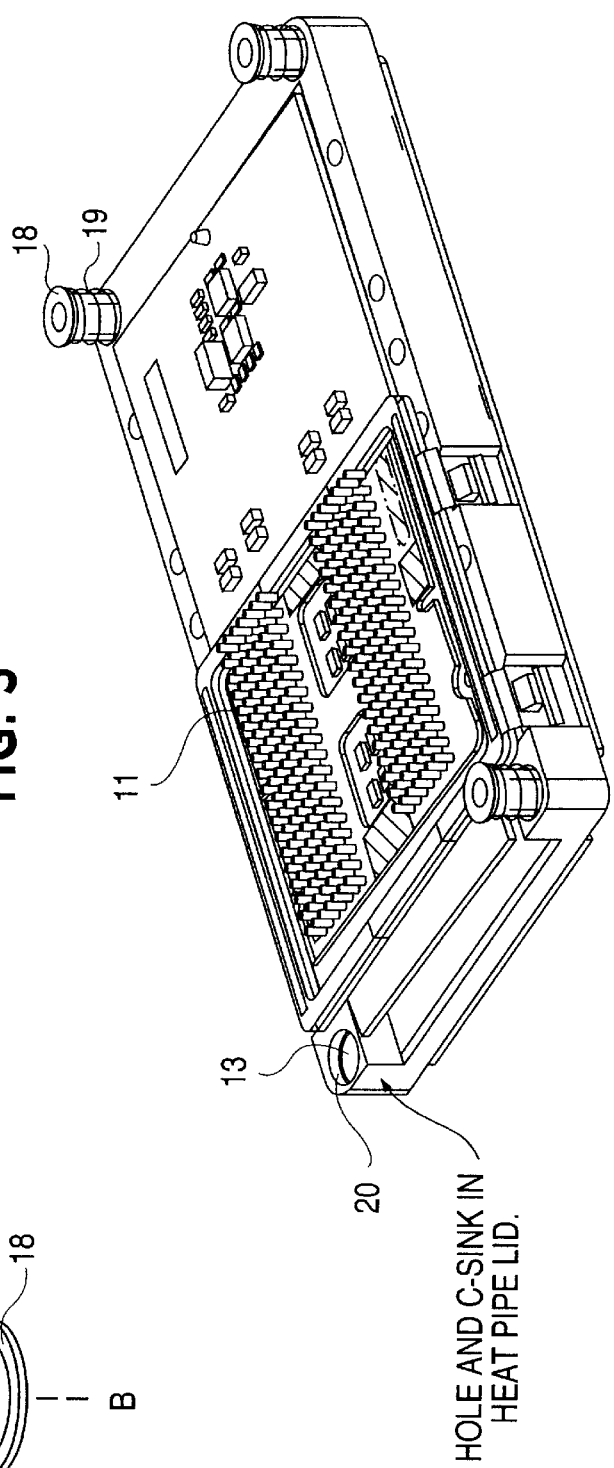

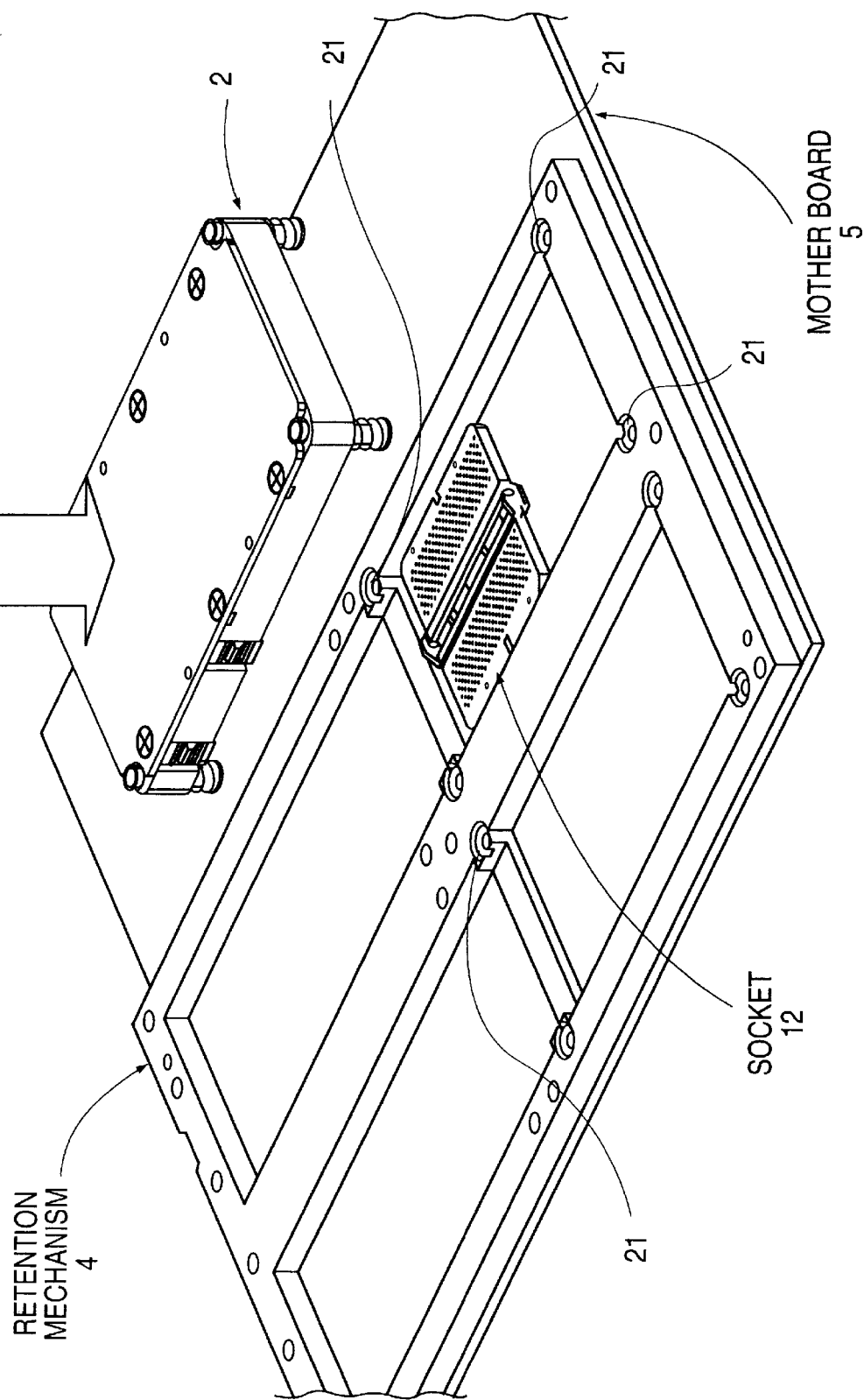

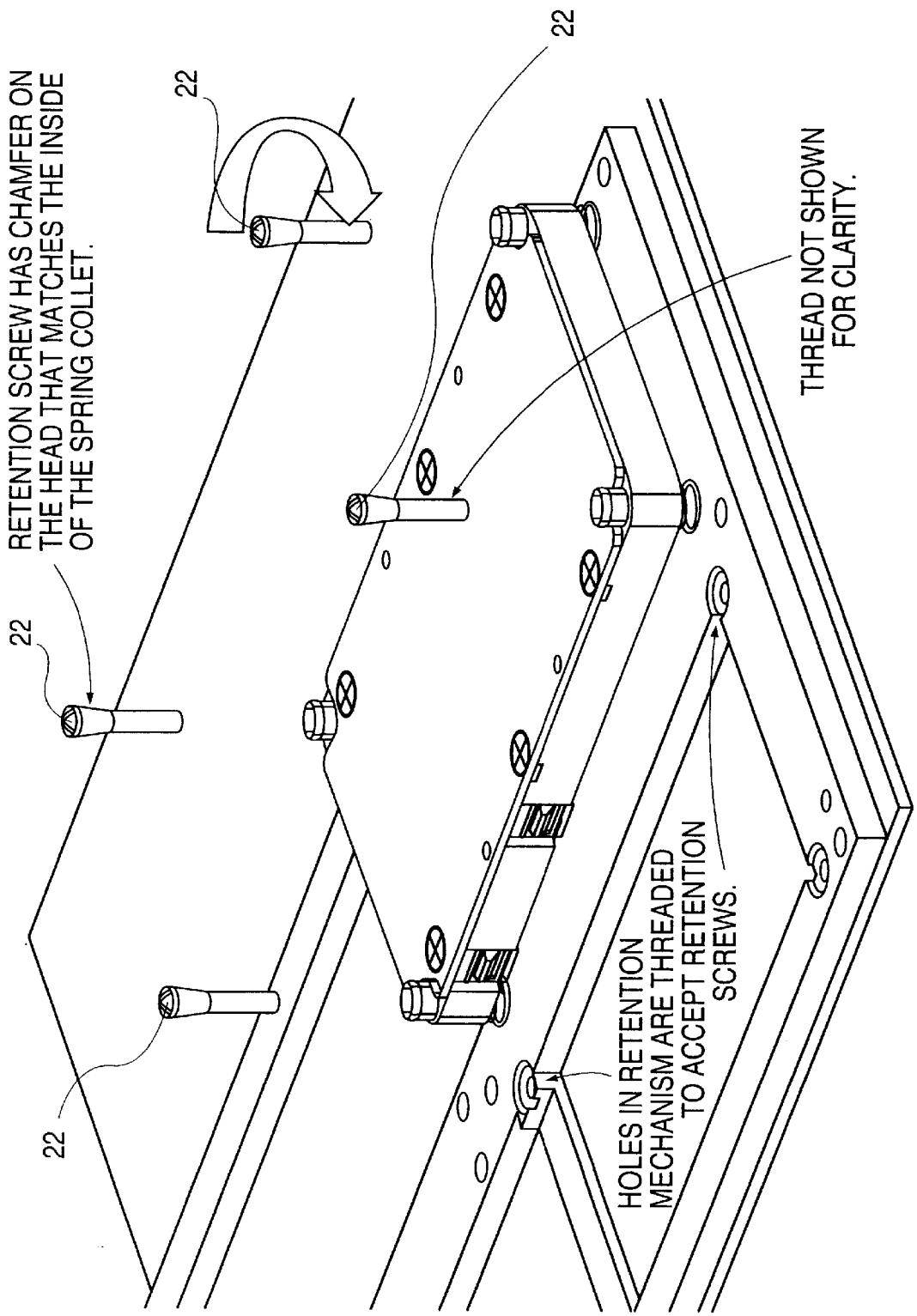

FASTENING SYSTEM AND METHOD OF RETAINING TEMPERATURE CONTROL DEVICES USED ON SEMICONDUCTOR DIES

FIELD

The present invention relates to a fastening system and method for holding and securing a temperature control device in heat conducting relation with the surface of a semiconductor die.

BACKGROUND

Temperature control devices for semiconductor dies such as silicon dies include but are not restricted to heat sinks, heat pipes, iso-chillers, heaters, heat exchangers, cold plates, iso-sinks, heat pumps, thermal electric coolers and heaters, and peltiers. To allow good temperature transfer, the temperature control devices are held and secured in heat conducting relation with the surface of the semiconductor dies. The semiconductor dies include but are not restricted to processor dies, central processing unit (CPU) dies, chip sets and substrates.

Most silicon dies are very brittle and do not withstand shock loading very well. This, in addition to the heavy temperature control devices, e.g., heat sinks, that are placed on top of the silicon dies presents a challenging problem in maintaining good heat transfer without damaging the dies.

Spring clips, per se, are a known type of fastener used on many existing products. While a spring clip can provide a consistent load between a silicon die and a temperature control device, a problem with the use of a spring clip is that it allows the load of the temperature control device to be transferred through the silicon die. There is a need for an improved fastening system and method which overcome this problem. The present invention addresses this need.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 3 is a view from the side and slightly above a collet spring of the fastening system of the invention.

FIG. 4 is a side view from slightly above the collet spring of FIG. 3, shown inverted, and in relation to an expansion spring of the fastening system.

FIG. 5 is a side view of the processor cartridge of FIG. 1 shown in assembled condition with three of four collet springs with expansion springs as shown in FIGS. 3 and 4, installed in holes of the temperature control device of the cartridge for use in retaining the assembly of the cartridge on a support member.

FIG. 6 is a side view from above of a support member in the form of a mother board with socket and retention mechanism over which the cartridge of FIG. 5 is placed for electrical connection of the socket with a pin grid array on a CPU aid substrate of the cartridge and retention of the temperature control device of the cartridge on the retention mechanism of the support member according to the fastening system of the invention.

FIG. 7 is a side view like FIG. 6 after the cartridge is installed and showing installation of the retention screws of the fastening system.

DETAILED DESCRIPTION

Figure 1:
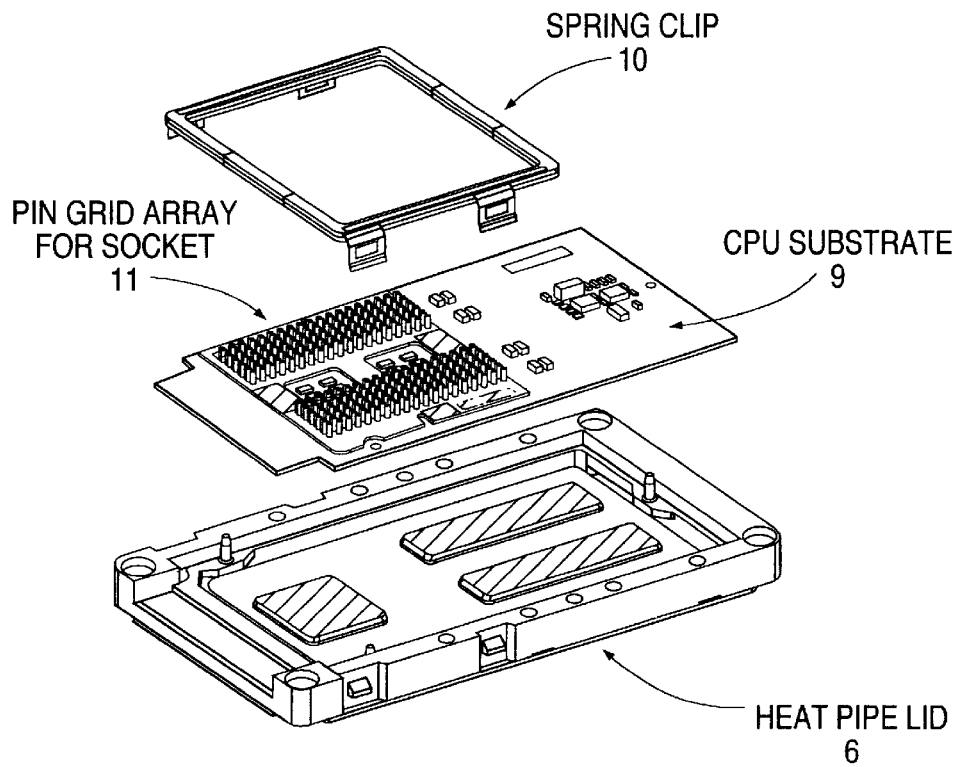
FIG. 1 is an exploded view of a processor cartridge from the bottom, for use in a fastening system according to the present invention.

Referring now to the drawings, the disclosed embodiment of the fastening system I of the invention is used to retain a processor cartridge 2 on a support member 3. The support member 3 in the disclosed embodiment is a retention mechanism 4 secured on a mother board 5. The fastening system 1 transfers the load of a temperature control device 6 of the processor cartridge 2 around silicon dies 7 of the processor cartridge, which are in heat-conducting relation with the temperature control device 6, by using a spring collet arrangement 8 to transfer the load from the temperature control device directly to the retention mechanism mounted on the mother board.

Figure 2:
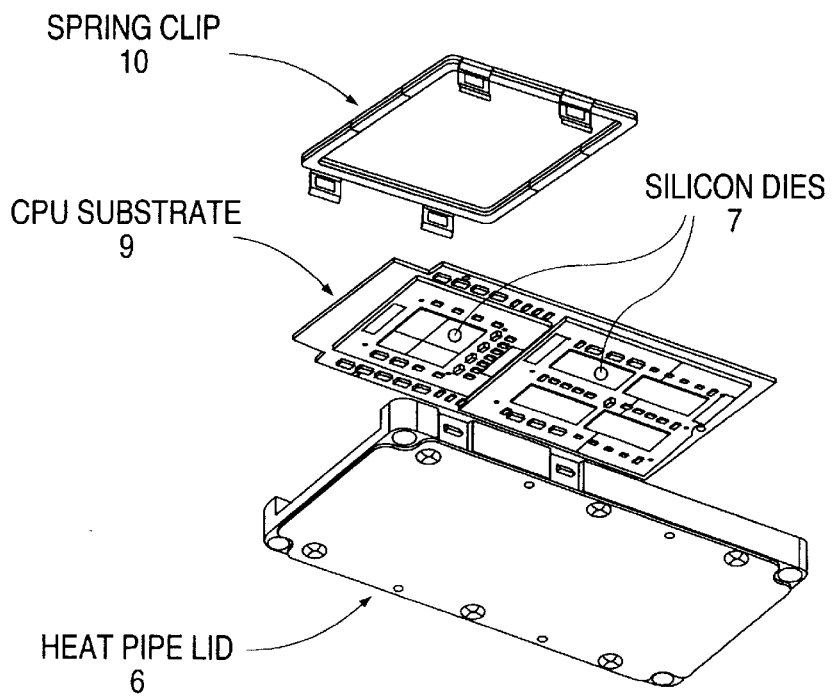
FIG. 2 is an exploded view of the processor cartridge of FIG. 1 from the top.

The processor cartridge 2 as shown in FIGS. 1 and 2 is an assembly involving a plurality of silicon dies 7 mounted on one side of a CPU substrate 9 for contact with the temperature control device 6. The device 6 is in the form of a heat pipe lid. The silicon dies 7 on the CPU substrate 9 are maintained in heat-conducting relation with the heat pipe lid 6 in the assembly of the processor cartridge 2 by a spring clip 10. The side of the CPU substrate 9 opposite the silicon dies 7 is provided with a pin grid array 11 for electrical connection with a socket 12 on the mother board 5 when the cartridge is installed on the mother board. The spring clip 10 provides a constant load between the silicon dies 7 and the heat pipe lid 6 to allow maximum heat transfer. The heat pipe lid 6 is formed with a plurality of holes 13 extending therethrough. The holes are for receiving respective ones of elongated mounting members 14, in the form of spring collets, of the spring collet arrangement 8.

Figure 9:
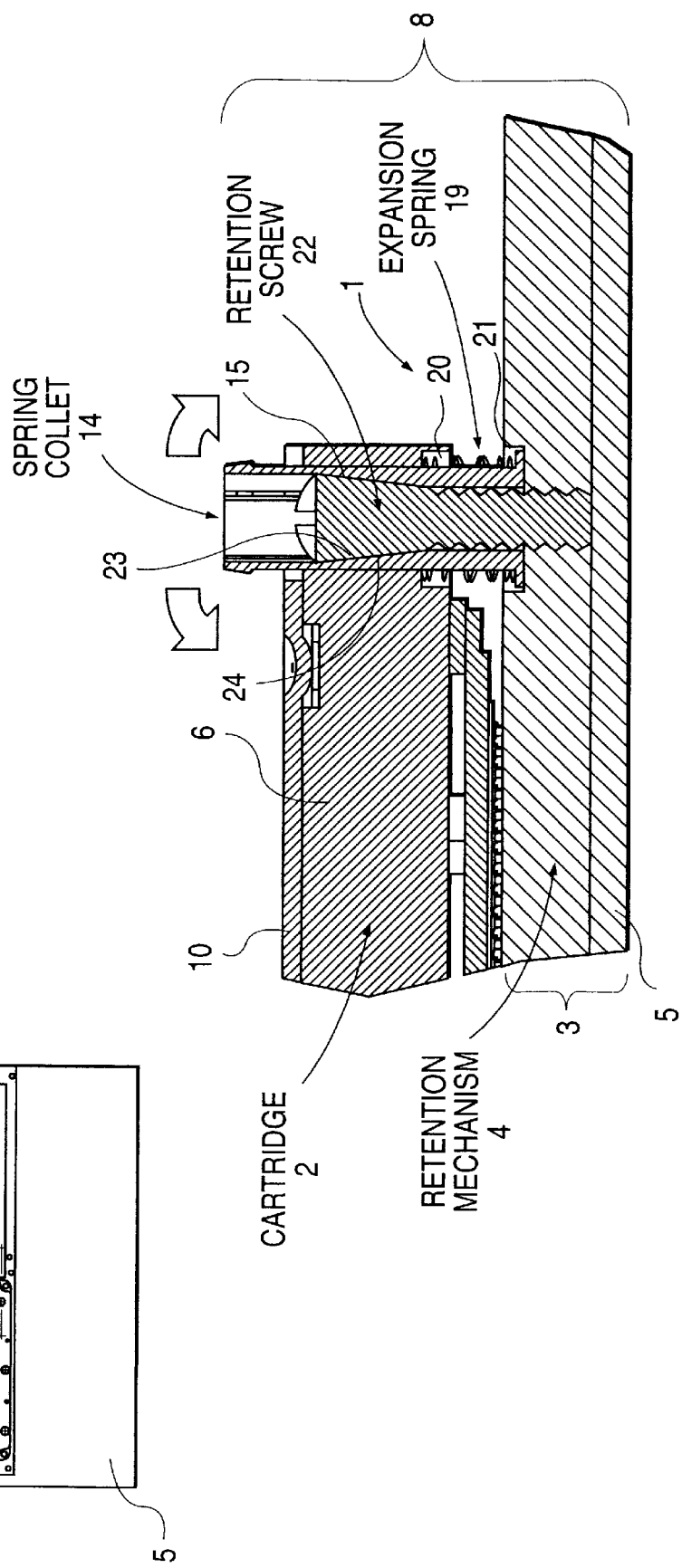
FIG. 9 is a sectional view of the fastening system of the disclosed embodiment taken along the section A—A in FIG. 8.

The spring collets 14, see FIGS. 3, 4, and 9, are each in the form of a sleeve 15 having slits 16 extending from one end thereof along the longitudinal axis B—B of the sleeve. A snap-fit 17 is formed at one end of the sleeve, and a flange 18 is provided at the opposite end for seating one end of an expansion spring 19 of the spring collet arrangement 8 provided about the spring collet in the assembled condition of the arrangement on the heat pipe lid 6. As shown in FIG. 5, the spring collets 14 and expansion springs 19 are installed into the respective holes 13 of the heat pipe lid 6. The holes 13 in the heat pipe lid are slightly larger in diameter than the spring collets, allowing the spring collets to be installed and moved freely in the axial direction B—B. The holes 24 are also countersunk at 20 to prevent the springs from being crushed. The expansion springs 19 bias the springs collet 14 in the open position, e.g., with flanged ends 18 maintained outwardly from the surface of the processor cartridge 2 so that the cartridge is always ready to be installed on the mother board 5, regardless of its orientation. The one-way snaps 17 allow the spring collets to be installed in the holes 13 but do not permit the spring collets to fall out of the holes after assembly.

Once the collets 14 and springs 19 are installed, the cartridge 2 is ready to be placed on the mother board 5. See FIG. 6. At this point, the cartridge 2 is positioned over the socket 12 and retention mechanism 4. The cartridge is then placed in the retention mechanism so that the bottom of the spring collets 14 rest in countersunk pockets 21 located on the retention mechanism. The expansion springs 19 cause the cartridge to sit above the socket 12. The cartridge is then forced down in the direction of the arrow in FIG. 6 against the bias of the expansion springs 19 until the pin grid array 11 of the cartridge is properly seated with the socket 12 on the mother board. The spring collets 14 of the fastening system 1 advantageously provide blind mating alignment of the pin grid array 11 of the cartridge into the socket 12, because the spring collets work as alignment pins, allowing movement along only one axis, e.g., in the direction of the longitudinal axis B—B of the spring collets.

Figure 8:
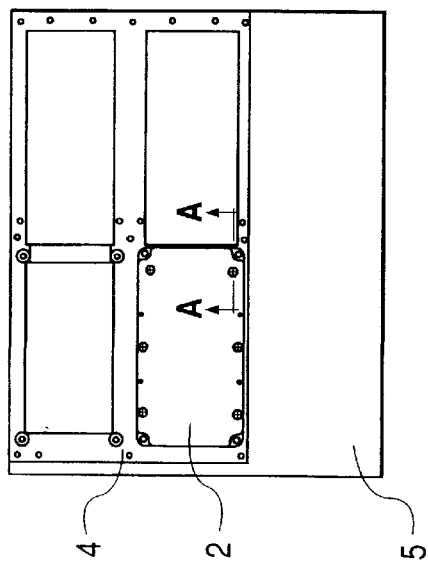
FIG. 8 is a view from the top of the installed cartridge of the support member of FIG. 7 showing the location of section A—A illustrated in FIG. 9.

After the pin grid array 11 of the cartridge 2 is seated in the socket 12, retention members 22 of the spring collet arrangement 8 of the fastening system 1 are installed to retain the processor cartridge 2 on the support member 3. The retention members 22 are in the form of retention screws, which have a chamfer 23 on the screw head that matches a chamfer 24 on the inside of the spring collet 14. The screw 22 is inserted into the top of the spring collet and is threaded into the retention mechanism 4. See FIGS. 7–9. When the chamfer 23 of the screw meets the chamfer 24 on the spring collet, the spring collet expands and locks the processor cartridge 2 into place. Because the top of the spring collet is split by slits 16, the spring collet is allowed to expand as the retention screw is driven into the retention mechanism. This expansion is limited to the size of the surrounding hole 13 in the heat pipe lid 6 of the cartridge 2. Once the spring collet has expanded to that hole size, it acts like a wedge, locking the cartridge into place with respect to the retention screw and retention mechanism.

While the fastening system and method of the invention for retaining temperature control devices used on semiconductor dies have been disclosed for use in an embodiment with the processor cartridge 2 having a heat pipe lid 6 as its temperature control device to be mounted upon a retention mechanism 4 of the mother board 5, the invention is not limited thereto, but is applicable to other arrangements. For example, other temperature control devices which can be retained include other types of heat pipe attachments, heat sinks, heat exchangers, iso-chillers, heaters, cold plates, iso-sinks, heat pumps, and thermal electric coolers. More specifically, the fastening system and method of the invention are particularly useful for retaining McKinley processor heat pipe and heat sink attachments, Merced processor heat pipe and heat sink attachments, and any temperature control device used on silicon dies. The expression "semiconductor dies" includes, but is not restricted to, processors dies, CPU dies, chip sets, and substrates. It is expected that the present invention will be of great value to future and existing 64-bit (Itanium/McKinley) and 32-bit products and can also be used on chip sets. The spring collets of the fastening system also enable a very large tolerance stack to be accommodated. The invention affords a simple and inexpensive method and fastening system for retaining temperature control devices without transferring the load thereof through the silicon dies in heat-conducting relation with the devices. In view of the above, we do not wish to be limited to the details shown and described herein, but intend to cover all such changes and modifications as are encompassed by the scope of the appended claims.

What is claimed is:

1. A fastening system for retaining on a support member an assembly of at least one semiconductor die and a temperature control device arranged in heat-conducting relation with said semiconductor die, said fastening system comprising:
   a support member;
   an assembly including at least one semiconductor die and a temperature control device arranged in heat-conducting relation with said semiconductor die, said temperature control device having at least one hole therein for receiving an elongated mounting member to mount said assembly on said support member;
   an elongated mounting member which can be installed in said hole in said temperature control device so as to extend outwardly from the temperature control device with said mounting member being movable in the hole relative to the temperature control device in the direction of elongation of said mounting member; and
   a retention member receivable in said mounting member for expanding said mounting member in the hole of the temperature control device into locking engagement with the temperature control device to prevent relative movement between the temperature control device and the mounting member in the direction of elongation of said mounting member.

2. The fastening system according to claim 1, wherein said assembly includes a spring clip holding said temperature control device and said at least one semiconductor in heat-conducting relation.

3. The fastening system according to claim 1, wherein said support member includes a retention mechanism connected to a mother board.

4. The fastening system according to claim 1, wherein said support member includes at least one pocket for receiving an end of said mounting member.

5. The fastening system according to claim 1, wherein said temperature control device is in the form of a heat pipe lid of said assembly.

6. The fastening system according to claim 1, wherein said semiconductor die is a silicon processor die.

7. The fastening system according to claim 1, wherein said elongated mounting member is a spring collet.

8. The fastening system according to claim 7, wherein said spring collet has a one-way snap on one end thereof that allows the collet to be installed in said hole in the temperature control device but prevents the collet from falling out of the hole after installation.

9. The fastening system according to claim 8, further comprising an expansion spring which can be telescoped over said one end of said spring collet, and wherein another end of said spring collet opposite said one end includes a retainer upon which one end of the said expansion spring can be seated.

10. The fastening system according to claim 1, wherein said system comprises a plurality of said elongated mounting members for installation in respective holes in said temperature control device and a plurality of said retention members receivable in respective ones of said mounting members.

11. The fastening system according to claim 1, wherein said retention member is a screw which can be extended through said mounting member for threaded connection with said support member, said screw having a chamfer which expands said mounting member as said screw is threaded into the support member.

12. A fastening system for retaining on a support member an assembly of at least one semiconductor die and a temperature control device arranged in heatconducting relation with said semiconductor die, said fastening system comprising:

an elongated mounting member which can be installed in a hole in the temperature control device so as to extend outwardly from the temperature control device with said mounting member being movable in the hole relative to the temperature control device in the direction of elongation of said mounting member, and a retention member receivable in said mounting member for expanding said mounting member in the hole of the temperature control device into locking engagement with the temperature control device to prevent relative movement between the temperature control device and the mounting member in the direction of elongation of said mounting member.

13. The fastening system according to claim 12, wherein said elongated mounting member is a spring collet.

14. The fastening system according to claim 13, wherein said spring collet has a one-way snap on one end thereof that allows the collet to be installed in a hole in the temperature control device but prevents the collet from falling out of the hole after installation.

15. The fastening system according to claim 14, further comprising an expansion spring which can be telescoped over said one end of said spring collet, and wherein another end of said spring collet opposite said one end includes a retainer upon which one end of said expansion spring can be seated.

16. The fastening system according to claim 12, wherein said system comprises a plurality of said elongated mounting members for installation in respective holes in said temperature control device and a plurality of said retention members receivable in respective ones of said mounting members.

17. The fastening system according to claim 12, wherein said elongated mounting member and said retention member have respective camming surfaces thereon which cooperate when said retention member is received in said mounting member to expand said mounting member.

18. The fastening system according to claim 12, wherein said retention member is a screw which can be extended through said mounting member for threaded connection with the support member, said screw having a chamfer which expands said mounting member as said screw is screwed into the support member.

19. A method for retaining on a supporting member an assembly of at least one semiconductor die and a temperature control device arranged in heat-conducting relation with said semiconductor die, said method comprising:

installing at least one elongated mounting member in a hole in said temperature control device of said assembly so that said mounting member extends outwardly from the temperature control device with said mounting member being movable in the hole relative to the temperature control device in the direction of elongation of said mounting member; and mounting said assembly directly on said supporting member by way of said elongated mounting member, said mounting including inserting a retention member in said mounting member to expand said mounting member in the hole of the temperature control device into locking engagement with the temperature control device to prevent relative movement between the temperature control device and the mounting member in the direction of elongation of said mounting member.

20. The method according to claim 19, wherein said mounting member is a spring collet and said retention member is a screw which is extended through said mounting member and screwed into the support member, said screw having a chamfer which expands said mounting member as said screw is screwed into the support member.

* * * * *